United States Patent [19]

Freyman et al.

[11] Patent Number: 5,663,677

[45] Date of Patent: Sep. 2, 1997

[54] INTEGRATED CIRCUIT MULTI-LEVEL INTERCONNECTION TECHNIQUE

[75] Inventors: Ronald Lamar Freyman, Bethlehem; Ted R. Martin, Allentown; Steven Paul Pekarich, Slatington, all of Pa.

[73] Assignee: Lucent Technologies Inc., Murray Hill, N.J.

[21] Appl. No.: 413,527

[22] Filed: Mar. 30, 1995

[51] Int. Cl.$^6$ ............................................. H01L 25/00
[52] U.S. Cl. ........................... 327/565; 327/564; 326/101; 257/211
[58] Field of Search ................................. 257/211, 758; 326/101; 327/564, 565

[56] References Cited

U.S. PATENT DOCUMENTS

| | | | |
|---|---|---|---|
| 4,906,872 | 3/1990 | Tanaka | 307/480 |
| 4,989,062 | 1/1991 | Takahashi et al. | 257/211 |
| 5,008,728 | 4/1991 | Yamamura et al. | 257/211 |
| 5,095,352 | 3/1992 | Noda et al. | 357/45 |
| 5,119,169 | 6/1992 | Kozono et al. | 357/68 |
| 5,315,182 | 5/1994 | Sakashita et al. | 327/565 |
| 5,350,886 | 9/1994 | Miyazaki et al. | 174/250 |
| 5,416,431 | 5/1995 | Strauss | 257/211 |

*Primary Examiner*—Timothy P. Callahan
*Assistant Examiner*—Jung Ho Kim
*Attorney, Agent, or Firm*—James H. Fox

[57] ABSTRACT

An improved integrated circuit conductor layout technique provides lower and upper conductor levels that bound circuit blocks and provide for power supply voltage distribution to the circuitry in the circuit blocks. The lower and upper conductor levels also provide for first and second groups of parallel signal conductors in wiring channels between circuit blocks. An intermediate conductor level is located between the lower and upper conductor levels, and conducts power supply voltages between adjacent circuit blocks. The power supply conductors formed in the intermediate conductor level also serve to isolate the signal conductors in the lower conductor level from the signal conductors in the upper conductor level (and vice-versa) in the wiring channel. This isolation typically improves the design of the integrated circuit by providing more reliable estimates of signal propagation in the wiring channels.

9 Claims, 3 Drawing Sheets

INTEGRATED CIRCUIT MULTI-LEVEL INTERCONNECTION TECHNIQUE

BACKGROUND OF THE INVENTION

1. Field of the Invention

The present invention relates to an integrated circuit having multiple conductor levels for interconnection of circuitry.

2. Description of the Prior Art

Integrated circuits (IC's) typically utilize multiple levels of conductors for distributing power supply voltages, as well as operational signals, between various portions of the IC. The conductors are most typically metal in the case of power supply distribution, usually aluminum, tungsten, titanium or gold, with still others (e.g., copper) being possible. These provide high conductivity and hence low voltage drop as power supply current flows. In the case of signal conductors, an even wider range of materials is often used, including doped polysilicon, metal silicides and metal nitrides in addition to the metals noted above. Conductors are formed by lithographically patterning a given level of conductive material, to form conductive lines as viewed from above an IC substrate. The conductor levels are separated from one another by dielectric layers for electrical insulation. The dielectric is often a glass (e.g., silicon dioxide including phosphorus and/or boron) at the lowest level (i.e., the level nearest the semiconductor substrate). The use of silicon dioxide is typical as an interlevel dielectric between the higher conductor levels (i.e., the levels overlying the lower conductor levels). The conductors may communicate by means of openings in the dielectric layers, referred to as "vias", with other conductor levels. The conductors also may communicate to doped device regions in the semiconductor substrate by means of openings in the lowest dielectric level, referred to as "contact windows".

The art of laying out the conductors has been developed to a high degree in the integrated circuit art. The factors that affect layout include the desire for a high density of interconnections while minimizing the length of interconnects. It is apparent that the more levels of conductors are available in a given IC technology, the more freedom is possible for laying out the conductors. In one typical 0.9 micron CMOS logic technology, one polycide (doped polysilicon/silicide) level and two aluminum levels are used. The bottom metal level is referred to as "metal 1", whereas the top metal level is referred to as "metal 2". However, as IC geometries shrink to the 0.5 micron level, the number of metal conductors levels has often been increased to three or more.

One typical form of conductor layout is illustrated in FIG. 1, wherein the metal conductors 109-115 lie in wiring channels between various ones of the functional circuit blocks 101-108. The metal conductors may extend from the wiring channels into the circuit blocks as indicated. Usually only the metal conductors are located within the wiring channels, while within a given circuit block, both the metal conductors and the polysilicon/silicide conductors are used. The circuit blocks shown are typical for use in a digital signal processor (DSP), which is chosen to be illustrative of the prior art. For example, a DSP typically includes a central processing unit (CPU) 101 that includes arithmetic address unit (AAU) 102, a sequence control unit (SCU) 103, a digital arithmetic unit (DAU) 104, and sometimes also a bit manipulation unit (BMU) 105. The CPU 101 communicates with a random access memory (RAM) 106, a read-only memory (ROM) 107, and an input/output (IO) unit 108. When implemented in two-metal level technology, the long conductors in the wiring channels (e.g., 109, 110, 111, 112, 113, 114, 115) are formed in metal 2. The short stubs that feed into the modules (e.g., 116, 117, 118, 119) are formed in metal 1, and connected to the associated metal 2 conductors with vias.

Some of the conductors (109, 111) turn the corner around a block (106) to change from a horizontal to a vertical conductor, while avoiding crossing over of another conductor. However, some conductors cross over other conductors. For example, conductor 110 connects to conductor 113 by means of a cross-under portion 120 that is formed in metal 1, and connected by means of vias 121 and 122. This allows conductor 112 to cross-over without connection to conductor 110. Still another example is cross-under conductor 123. Note that the boundaries of the circuit blocks are shown as dotted lines. These boundaries may include power and ground ($V_{DD}$ and $V_{SS}$) conductors, typically in metal 2. For example, in one case $V_{DD}$ was used on two sides of a circuit block, whereas $V_{SS}$ was used on the other two sides. In another case, a $V_{DD}$ encompassed an entire circuit block, whereas $V_{SS}$ encompassed another circuit block. The stubs that feed $V_{DD}$ and/or $V_{SS}$ into the modules are then typically implemented in metal 2. At these places the interconnect wires cross under in metal 1.

The use of three (or more) metal levels is also known in the integrated circuit art. In one case, the power and ground conductors are formed in the wiring channels parallel to the signal conductors. These power supply conductors then turn into the circuit blocks (i.e., at right angles to the wiring channels), and are jumpered down by vias to the metal 2 and metal 1 conductors as required inside the circuit blocks.

SUMMARY OF THE INVENTION

We have invented an improved integrated circuit conductor layout technique. Lower and upper conductor levels bound a circuit block on at least one side and provide for power supply voltage distribution to the circuitry in the circuit block. The lower and upper conductor levels also provide for first and second groups of parallel signal conductors in wiring channels between circuit blocks. An intermediate conductor level is located between the lower and upper conductor levels, and conducts power supply voltages between adjacent circuit blocks.

DETAILED DESCRIPTION

Figure 1:
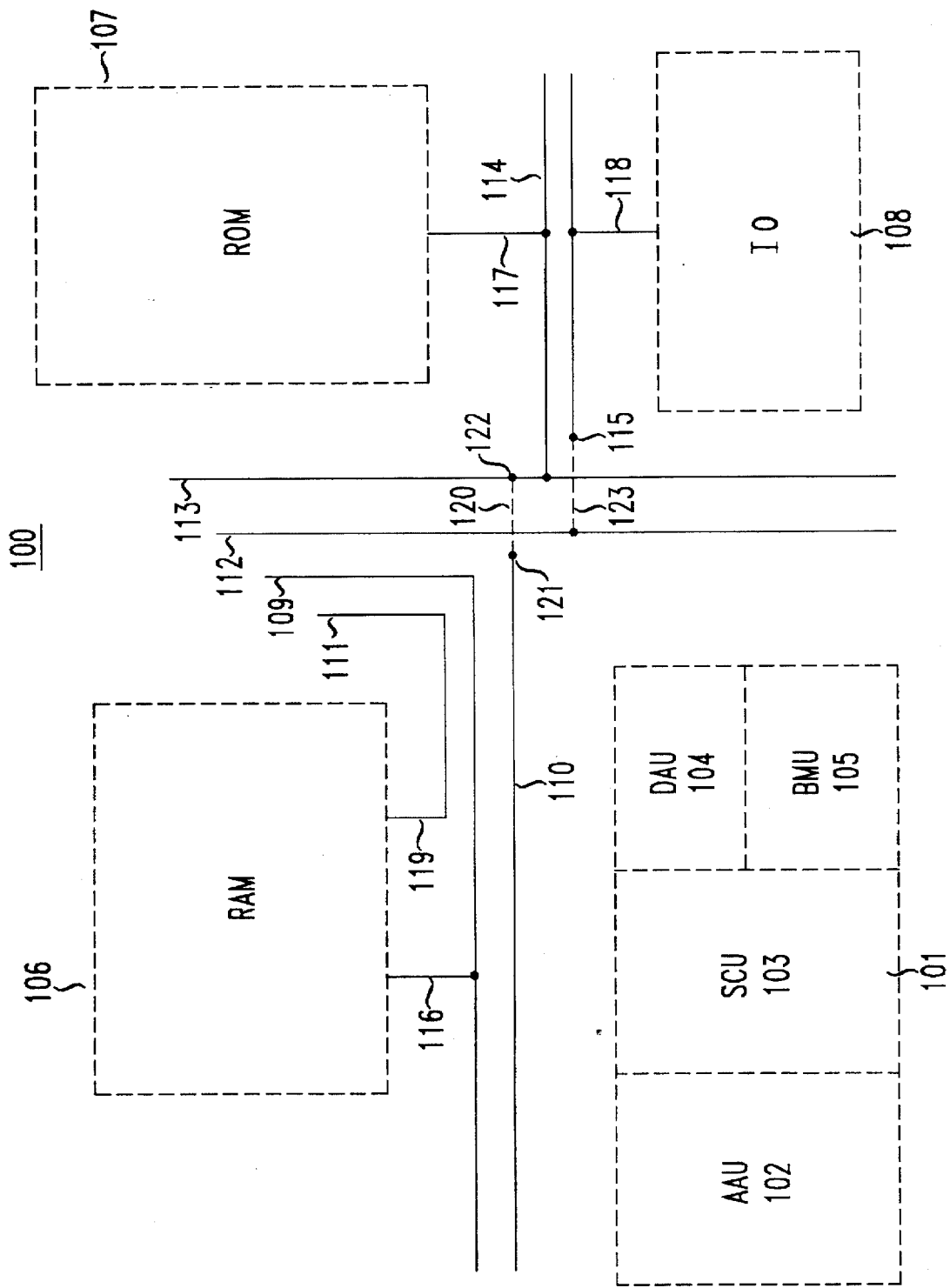
FIG. 1 shows a typical prior-art conductor layout technique.
Figure 2:
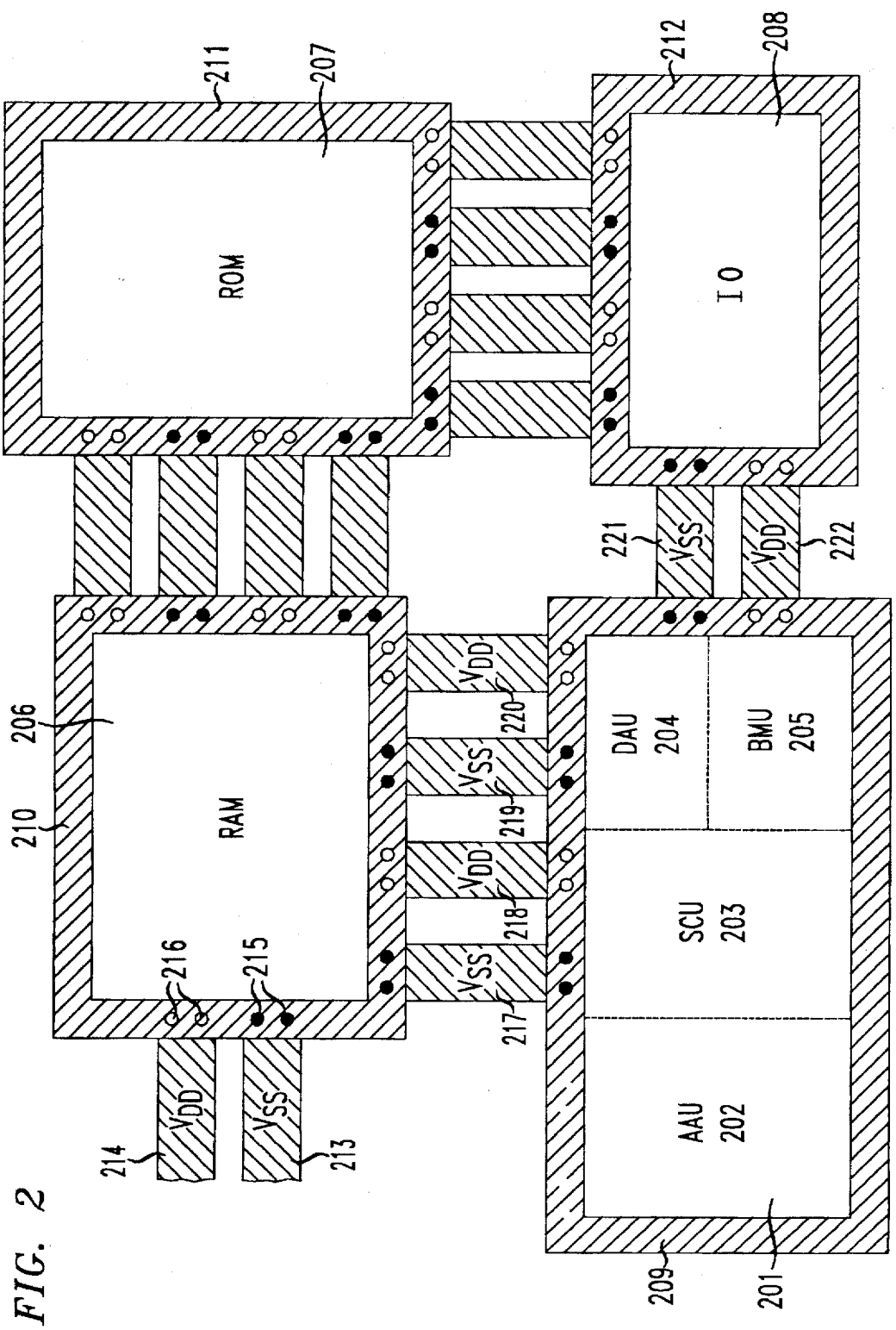
FIG. 2 shows power supply conductors in an illustrative embodiment of the present invention.

The following detailed description relates to an integrated circuit having an improved conductor layout. Referring to FIG. 2, an illustrative embodiment shows how circuit blocks that implement functionality comparable to those shown in FIG. 1 may be provided with power supply voltages by the inventive technique. The illustrated circuit blocks 201, 206, 207 and 208 are bounded by two overlying levels of conductors, shown collectively in top view with associated conductor vias. For example, the CPU circuit block 201, comprising circuit sub-blocks 202-205, is bounded by conductor 209. Each conductor bounding a circuit block comprises an upper conductor seen in FIG. 2, and also a lower conductor that is hidden from view by the upper conductor. In the following discussion, the lower conductor is indicated as a "prime" of the corresponding upper conductor. The upper conductor is connected to a source of a first power supply voltage, illustratively $V_{SS}$, whereas the lower conductor is connected to a source of a second power supply voltage, illustratively $V_{DD}$, as discussed further below. In addition, intermediate level conductors are used to distribute power supply voltages between blocks, as discussed in detail below. As used herein, the term "intermediate power supply conductor" means a power supply conductor that is formed from an intermediate conductor level. An "intermediate conductor level" is a conductor level above the lower conductor level and below the upper conductor level with respect to the semiconductor substrate on which the integrated circuit is formed.

The connection of the upper and lower conductors to the power supply voltage sources external to the integrated circuit may be accomplished by a variety of techniques. In the preferred embodiment, intermediate level conductors 213 and 214 on the outer periphery of block 206 supply voltages $V_{SS}$ and $V_{DD}$ respectively from power supply bondpads (not shown) to the upper conductor 210 and lower conductor 210' through vias 215 and 216, respectively. Although only two peripheral conductors (213, 214) are illustrated, typically still other power supply conductors are similarly provided on the outer peripheries of the other blocks as well. The vias 215 connect the upper conductor 210 to the intermediate $V_{SS}$ conductor 213, and hence are shown as solid circles in FIG. 2. The vias 216 connect the lower conductor 210' to the intermediate $V_{DD}$ conductor 214; hence the vias 216 are shown as open circles to indicate that they are hidden from view.

Also seen in FIG. 2 are intermediate power supply conductors that connect the adjacent blocks, providing conduction of power supply voltages to the upper and lower conductors that bound the blocks. (The signal conductors are omitted from the wiring channels in FIG. 2 for clarity of illustration). For example, the intermediate power supply conductor 221 provides conduction of the $V_{SS}$ voltage between the upper conductor 209 (block 201) and the upper conductor 212 (block 208). Similarly, the intermediate power supply conductor 222 provides conduction of the $V_{DD}$ voltage between the lower conductor 209' (block 201) and the lower conductor 212' (block 208). Similarly, the intermediate power supply conductors 217, 219 provide connection of the upper ($V_{SS}$) conductors of adjacent blocks 201 and 206, whereas intermediate power supply conductors 218, 220 provide connection of the lower ($V_{DD}$) conductors of adjacent blocks 201 and 206, thereby distributing the $V_{SS}$ and $V_{DD}$ power supply voltages respectively. It can be seen that the upper and lower conductors of block 207 are similarly connected to the upper and lower conductors of adjacent blocks 206 and 208 by intermediate power supply conductors, not numbered for clarity of illustration. In this manner, the power supply may be efficiently distributed to the various circuit blocks.

The upper and lower conductors that bound a circuit block serve as distribution busses for power supply voltages to circuitry within their associated blocks. The distribution of power supply voltages within a given block may be accomplished by means of distribution conductors (not shown) in any desired conductor arrangement. For example, in a presently-preferred embodiment a grid of horizontal and vertical (as defined by FIG. 2) distribution conductors that run across a given circuit block is used. In that scheme, the intermediate conductor level (e.g., metal 2) may be used to provide spaced $V_{DD}$ and $V_{SS}$ power distribution conductors that run horizontally across a given circuit block. These horizontal distribution conductors may directly connect (i.e., without vias) to the intermediate power supply conductors that run across the wiring channels from the adjacent circuit blocks. In addition, the upper conductor level (e.g., metal 3) may be used to provide spaced $V_{DD}$ and $V_{SS}$ power distribution conductors that run vertically across a given circuit block. These vertical distribution conductors that carry $V_{SS}$ may then connect directly to the upper conductor that bounds the given circuit block, and the vertical distribution conductors that carry $V_{DD}$ may then connect by means of vias down to the lower conductor that bounds the given circuit block. However, various other distribution arrangements are possible for use with the present invention.

Figure 3:
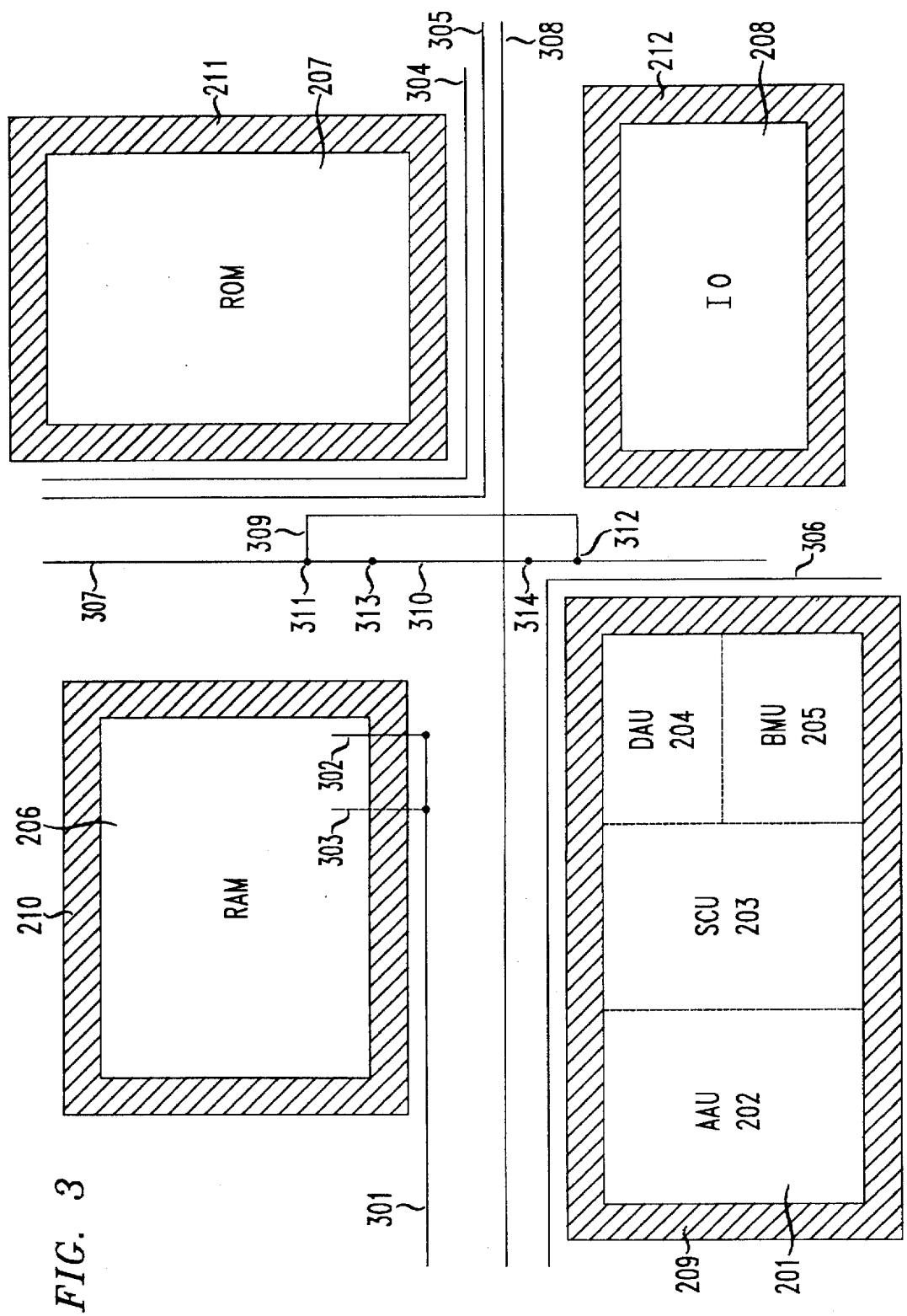
FIG. 3 shows signal conductors in the illustrative embodiment.

Other features of the illustrative embodiment are shown in FIG. 3, wherein signal conductors in the routing channels are illustrated. These signal conductors are formed from the upper and lower conductor levels. (The intermediate power supply conductors discussed above are omitted from the wiring channels in FIG. 3 for clarity of illustration). In the present invention, signal conductors of the upper conductor level (the "upper signal conductors") may directly overlie signal conductors of the lower conductor level (the "lower signal conductors") in a given wiring channel. The lower signal conductor that underlies a given upper signal conductor is indicated by a prime in discussions herein. For example, upper signal conductor 301 is illustrated, with lower signal conductor 301' lying thereunder. Note that a feed 302 in the upper conductor level (e.g., metal 3) may be used to bring conductor 301 into the RAM block 206. Similarly, a feed 303 in the lower conductor level (e.g., metal 1) may be used to bring conductor 301' into the RAM block 206. Although only a few signal conductors are illustrated for clarity, a typical wiring channel includes from 10 to 100 conductors, with a wider range being possible.

When the conductors lie at right angles, provision is made to allow one to pass over the other if an interconnection between them is to be avoided. For example, vertical (as viewed) conductor 307 lies at right angle to horizontal conductor 308, both formed in the upper conductor level. In the vicinity of intersection, the conductor 307 is transferred to an intermediate level conductor 309 by means of vias 311 and 312, thereby avoiding contact with conductor 308 at the intersection. In addition, it is possible for the underlying conductor 307' to avoid contact to underlying conductor 308' at the intersection, by transferring it to intermediate conductor 310 by means of vias 313 and 314.

Note that to implement the transferal of the conductors 307 and 307' to the intermediate conductors 309 and 310, it is necessary to provide for a double track width of the intermediate conductor. Therefore, when conductors go around the corner of a block, it is deskable to comb the turning conductors to the inside of the tracks. For example, conductors 304 and 305 (and 304' and 305') lie on the inside of the track as they go around the lower-left corner of ROM block 207. Similarly, conductor 306 (and 306') lies on the inside track as it goes around the upper-right corner of CPU block 201. Each pair of upper/lower conductors that goes around the corner opens up a track in the intermediate conductor level. Therefore, if half of the conductors in a wiring channel go around a corner at a given intersection, then it is not necessary to provide additional width to the wiring channel to provide for the above-noted double track width of the intermediate conductors.

Note that the upper and lower signal conductors (FIG. 3) are separated by the intermediate power supply conductors (FIG. 2). These intermediate power supply conductors, whether $V_{DD}$ or $V_{SS}$, are at ground potential with respect to the alternating-current (AC) signals conducted by the upper and lower signal conductors. Therefore, a high degree of shielding of the upper signal conductors from the lower signal conductors (and vice-versa) in a wiring channel is accomplished using the intermediate level conductors for power supply distribution. One advantage of this shielding is that the simulation of circuit operation may be more accurately accomplished using computer-aided circuit simulators. This is because the signals in the upper and lower conductors may be considered to not interact, or at least interact to a significantly reduced extent, in integrated circuits implementing the present invention. There is typically an additional degree of capacitance added to the signal conductors by the presence of the intermediate power supply conductors. However, we have determined that in a typical case this does not unduly degrade the speed of circuit operation, and the ability to more accurately model worst-case conditions is significantly aided by the ability to assume that no interactions between the upper and lower signal conductors occur. Therefore, the likelihood of proper circuit operation may be enhanced by use of the inventive technique, in addition to the advantages of power supply distribution noted above. To obtain this advantage, we recommend that the intermediate power supply conductors cover at least 50 percent, and preferably at least 80 percent, of the area in the wiring channels.

When using a p-type silicon substrate connected to $V_{SS}$, it is desirable to connect the lowest conductor level (e.g., metal 1) that bounds a circuit block to $V_{DD}$, in order to increase total capacitance and hence reduce noise in the power supply, and also improve electrostatic discharge (ESD) protection. Also, this allows the use of the upper conductor level (e.g., metal 3) to connect to $V_{SS}$. That is desirable in the typical case that metal 3 is relatively thicker than metal 1 or metal 2. The $V_{SS}$ and $V_{DD}$ conductors in the intermediate level (e.g, metal 2) typically alternate, which facilitates power supply connections within the bounded circuit block. However, this is not necessarily the case, and occasionally two (or more) adjacent intermediate level conductors will carry either both $V_{DD}$ or $V_{SS}$.

Note that still other levels may be present above the "upper" conductor level referred to herein, and/or below the "lower" conductor level referred to herein. Furthermore, still other levels in addition to the "intermediate" level referred to herein may be located between the "upper" and "lower" levels. For example, in a four metal level technology, the first and fourth levels may be used as indicated above with respect to the lower and upper levels, respectively. Either the second or third level may then be used as the intermediate power supply conductor level as described above. This makes available the other one of the second or third levels for use as signal interconnects, which may be run between adjacent blocks (i.e., parallel to the intermediate level power supply conductors) if desired, or alternatively along the wiring channels. Still other uses of the inventive technique are possible when four or more interconnect levels are available.

Furthermore, while the above illustrative embodiment has shown all adjacent sides of the circuit blocks interconnected by the intermediate power supply conductors, that is of course not possible for the edges of the blocks that are not adjacent other circuit blocks. In some cases, only a single edge of a circuit block is bounded by power supply conductors according to the inventive technique. Furthermore, still other portions of the integrated circuit (not illustrated above) may use conventional conductor placement techniques, although of course not obtaining the advantages of the inventive technique in those portions of the circuitry. Thus, the inventive technique may be practiced on only two adjacent blocks if desired. Also note that the illustrative embodiment has shown the upper conductor bounding a given block being connected to an upper conductor bounding the adjacent block (and similarly showing the lower bounding conductors connected). However, that is not necessary, since the intermediate power supply conductors may connect an upper conductor bounding a given block to the lower conductor bounding an adjacent block while still obtaining various of the above-noted advantages. Still other variations are possible.

The invention claimed is:

1. An integrated circuit having a first block of functional circuitry separated by a wiring channel from a second block of functional circuitry, and with said integrated circuit having a lower conductor level, an intermediate conductor level, and an upper conductor level, characterized in that said first block and said second block of functional circuitry are each bounded on at least one side by a first power supply conductor formed in said lower conductor level and also by a second power supply conductor formed in said upper conductor level, and further characterized in that conductors formed in said intermediate conductor level connect the power supply conductors bounding said first block to the power supply conductors bounding said second block, wherein said wiring channel comprises first signal conductors formed in said lower conductor level and second signal conductors formed in said upper conductor level, wherein at least some of said first signal conductors directly overlie at least some of said second signal conductors in said wiring channel.

2. The invention of claim 1 wherein said conductors formed in said intermediate conductor level cover at least 50 percent of the area of said wiring channel, whereby said first signal conductors are isolated from said second signal conductors.

3. The invention of claim 1 wherein said conductors formed in said intermediate conductor level cover at least 80 percent of the area of said wiring channel, whereby said first signal conductors are isolated from said second signal conductors.

4. The invention of claim 1 wherein:

a first set of conductors formed in said intermediate conductor level connects said first power supply conductor that bounds said first block to said first power supply conductor that bounds said second block; and a second set of conductors formed in said intermediate conductor level connects said second power supply conductor that bounds said first block to said second power supply conductor that bounds said second block.

5. The invention of claim 4 wherein conductors of said first set alternate with conductors of said second set along said wiring channel.

6. The invention of claim 1 wherein said lower conductor level is a metal level, said intermediate conductor level is a metal level, and said upper conductor level is a metal level.

7. An integrated circuit having a first block of functional circuitry separated by a wiring channel from a second block of functional circuitry, and with said integrated circuit having a first metal level, a second metal level, and a third metal level, characterized in that said first block and said second block of functional circuitry are each bounded on at least one side by a $V_{DD}$ power supply conductor formed in said first metal level and also by a $V_{SS}$ power supply conductor formed in said third metal level, and further characterized in that conductors formed in said second metal level connect the power supply conductors bounding said first block to the corresponding power supply conductors bounding said second block.

and still further characterized in that said wiring channel comprises first signal conductors formed in said first metal level and second signal conductors formed in said second metal level, wherein at least some of said first signal conductors directly overlie at least some of said second signal conductors in said wiring channel.

8. The invention of claim 7 wherein said conductors formed in said second metal level cover at least 80 percent of the area of said wiring channel, whereby said first signal conductors are isolated from said second signal conductors.

9. The invention of claim 7 wherein at least one of the first and second blocks of functional circuitry is bounded on all sides by the $V_{DD}$ and $V_{SS}$ power supply conductors.

* * * * *

UNITED STATES PATENT AND TRADEMARK OFFICE
CERTIFICATE OF CORRECTION

PATENT NO.    : 5,663,677
DATED         : September 2, 1997
INVENTOR(S)   : Freyman et al.

It is certified that error appears in the above-identified patent and that said Letters Patent is hereby corrected as shown below:

Column 6,
Line 31, change "lower" to -- upper --.
Line 32, change "upper" to -- lower --.

Signed and Sealed this

Twenty-second Day of April, 2003

JAMES E. ROGAN
*Director of the United States Patent and Trademark Office*